(12) United States Patent
Ying et al.

(10) Patent No.: US 6,579,796 B2
(45) Date of Patent: Jun. 17, 2003

(54) METHOD OF ETCHING PLATINUM USING A SILICON CARBIDE MASK

(75) Inventors: Chentsau Ying, Cupertino, CA (US); Jeng H. Hwang, Cupertino, CA (US); Luc Van Autryve, Mennecy (FR)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/013,605

(22) Filed: Dec. 10, 2001

(65) Prior Publication Data

US 2003/0036264 A1 Feb. 20, 2003

(30) Foreign Application Priority Data

Jul. 6, 2001 (KR) .................................. 10-2001-0040309

(51) Int. Cl.[7] ............................................. H01L 21/302
(52) U.S. Cl. ........................ 438/689; 438/706; 438/710
(58) Field of Search ................................. 438/689, 706, 438/710, 711, 714, 720

(56) References Cited

U.S. PATENT DOCUMENTS

| | | | | |
|---|---|---|---|---|
| 5,976,394 A | * | 11/1999 | Chung | 216/67 |
| 6,054,391 A | * | 4/2000 | Nam et al. | 438/706 |
| 6,077,450 A | * | 6/2000 | Lee | 216/72 |
| 6,169,009 B1 | * | 1/2001 | Ju et al. | 438/396 |
| 6,177,351 B1 | * | 1/2001 | Beratan et al. | 438/694 |
| 6,287,975 B1 | * | 9/2001 | DeOrnellas et al. | 438/710 |

* cited by examiner

*Primary Examiner*—Kamand Cuneo
*Assistant Examiner*—Scott B. Geyer
(74) *Attorney, Agent, or Firm*—Shirley L. Church; Kathi Bean; Joseph Bach (57) ABSTRACT

Disclosed herein is a method of etching platinum using a silicon carbide mask. The method comprises providing an etch stack including a patterned silicon carbide layer overlying a layer of platinum, then pattern etching the platinum layer using a plasma generated from a source gas comprising $Cl_2$, $BCl_3$, and a nonreactive, diluent gas. The silicon carbide mask can be deposited and patterned using standard industry techniques, and can be easily removed without damaging either the platinum or an underlying doped substrate material. The method provides a smooth platinum etch profile and an etch profile angle of about 75° to about 90°. Also disclosed herein are methods of forming semiconductor structures useful in the preparation of DRAM and FeRAM cells.

43 Claims, 12 Drawing Sheets

METHOD OF ETCHING PLATINUM USING A SILICON CARBIDE MASK

BACKGROUND OF THE INVENTION

1. Field of the Invention

The present invention pertains to a method of etching platinum using a silicon carbide mask. The present invention also pertains to methods of forming various semiconductor structures useful in the preparation of DRAM and FeRAM cells.

2. Brief Description of the Background Art

Dynamic random access memory (DRAM) cells are the current generation of high density memory cells. Ferroelectric random access memory (FeRAM) cells have been introduced as a future generation of very high density memory cells, potentially at the giga bit level and beyond. There are two basic requirements for storage capacitors for use in high density memory cells: 1) long retention time; and 2) tolerance to a large number of data refresh operations without significant deterioration of the charge characteristics during the lifetime of the memory cells. For example, for non-volatile memory (NVM) applications, the desired data retention time is over 10 years; for DRAM applications, data refresh operations may be performed more than one million times over the lifetime of the storage capacitors.

Recently, noble metals, such as platinum, iridium, and ruthenium, have been evaluated as new materials for electrodes of storage capacitors. Noble metals are known to have several advantages over conventional metals such as aluminum, including: 1) forms chemically and physically stable interfaces with high dielectric constant materials, such as PZT; 2) forms good electrical contacts with other metals used for interconnection; and 3) stable under high temperature $O_2$ ambient processes.

Storage capacitors formed with noble metals as electrodes and high dielectric constant materials show excellent characteristics in terms of data retention time and allowable refresh operations. As a result, storage capacitors formed with high dielectric constant materials and noble metals are viable candidates for the future generation of storage capacitors.

The formation of a storage capacitor including platinum typically involves pattern etching of a previously deposited platinum layer. One of the problems encountered with pattern etching of platinum is the identification of a suitable mask material. A suitable mask material for etching platinum must meet the following requirements: 1) the mask material must be capable of being deposited and patterned using standard industry techniques; 2) to avoid mask erosion during platinum etching, the mask material should not be easily etched using the etch chemistry used to etch the platinum (i.e., there should be good selectivity for etching platinum relative to the mask material); 3) the mask material must not be eroded during the etch process, such that a vertical (i.e., 80°–90°) etch profile can be obtained; and 4) at the end of etching, the mask material must be easily removable without disturbing other material layers within the etch stack.

Silicon oxide is currently used as a hard mask material for etching platinum. Silicon oxide meets the first three of the four requirements listed above. However, silicon oxide is not easily removable without disturbing other material layers within the etch stack when the etch stack includes an exposed doped dielectric layer or semiconductor substrate.

Figure 2A:
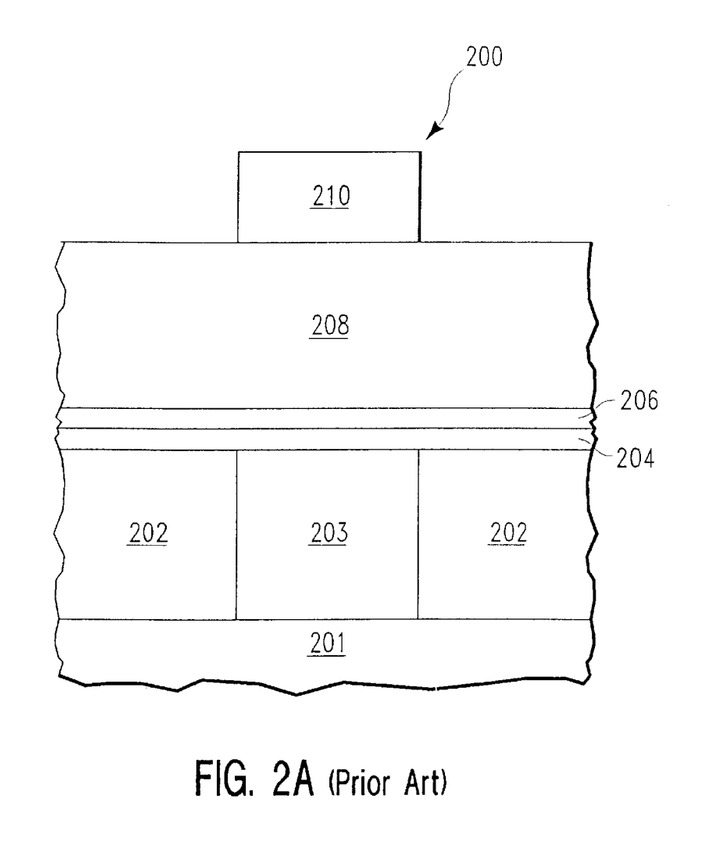
FIGS. 2A–2E illustrate a prior art method of forming a semiconductor structure 200 useful in the formation of a DRAM cell.
Figure 2B:
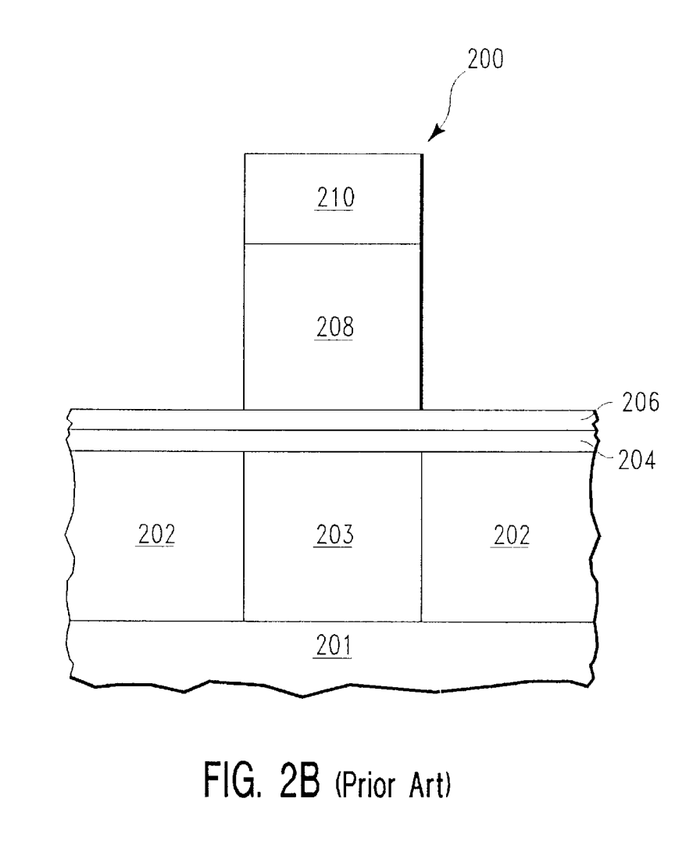
Figure 2C:
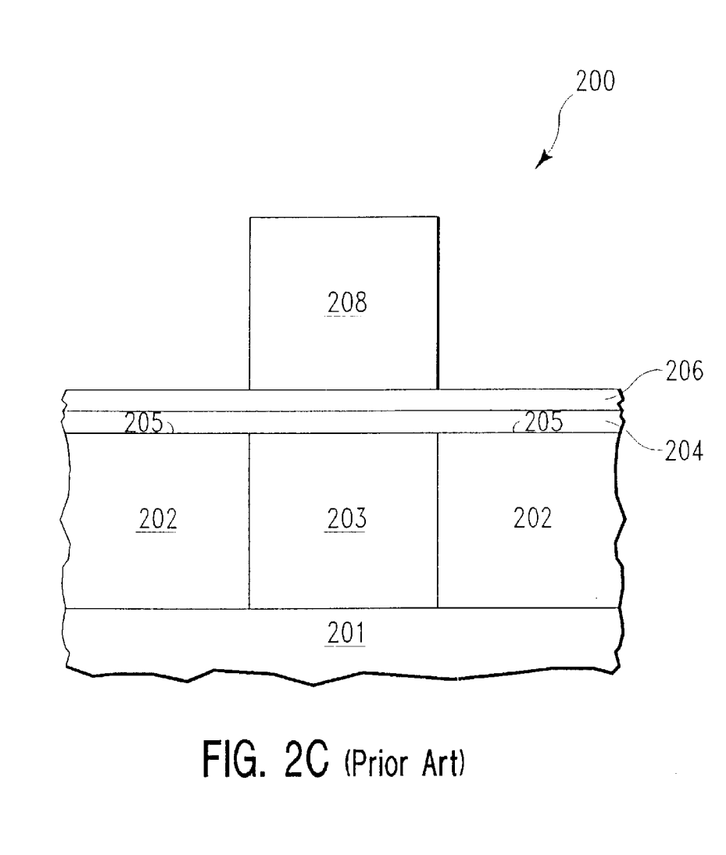
Figure 2D:
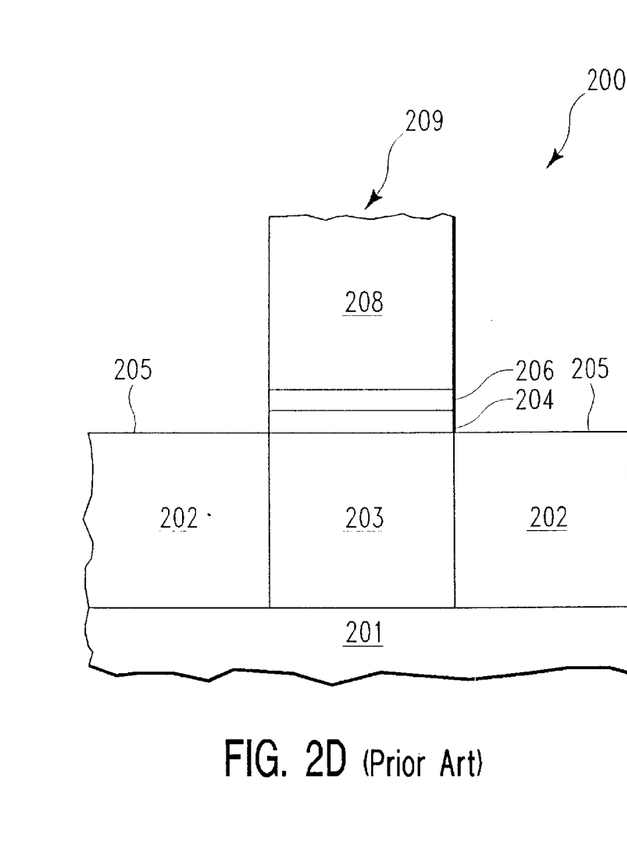
Figure 2E:
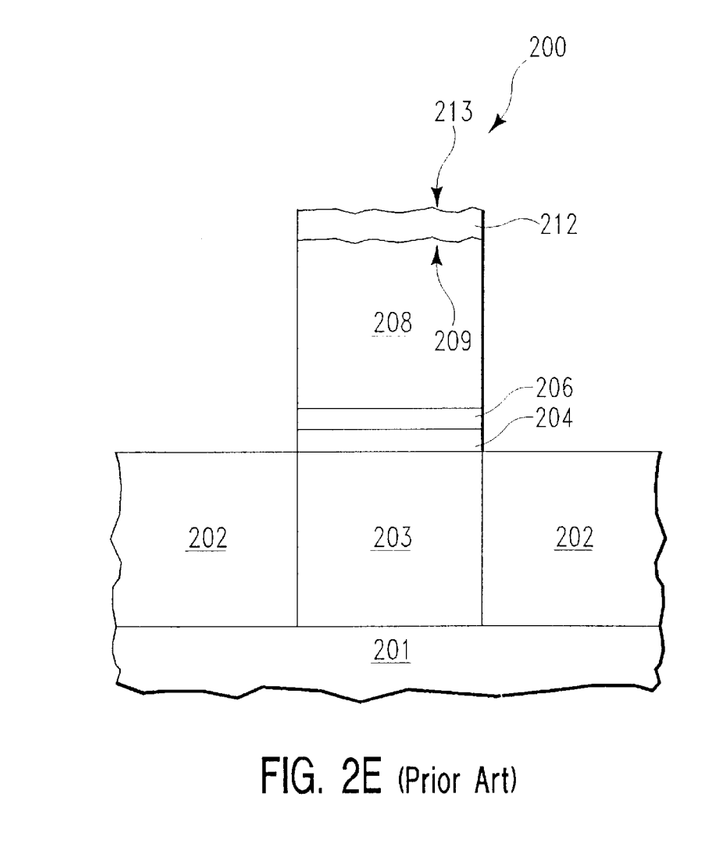

A current method of forming a semiconductor structure for use in the production of a DRAM cell is illustrated in FIGS. 2A–2E. FIG. 2A shows a typical starting structure 200 for forming the semiconductor structure. The starting structure 200 includes, from top to bottom, a patterned silicon oxide mask layer 210, a layer 208 of platinum, a layer 206 of titanium nitride, a layer 204 of titanium, a doped premetal dielectric (PMD) layer 202, overlying a semiconductor substrate 201. A tungsten plug 203 has been previously formed in doped PMD layer 202. Referring to FIG. 2B, the platinum layer 208 is pattern etched using the silicon oxide layer 210 as a mask. However, due to the difficulty in removing the silicon oxide masking layer 210 without etching into the underlying doped PMD layer 202, the silicon oxide layer 210 must be removed prior to etching the titanium nitride and titanium layers 206, 204. Following the removal of silicon oxide layer 210 (as shown in FIG. 2C), the titanium nitride and titanium layers 206, 204 are pattern etched, exposing an upper surface 205 of doped PMD layer 202, as shown in FIG. 2D. The overlying patterned platinum layer 208 is used as a mask for pattern etching the titanium nitride and titanium layers 206, 204. However, the exposed upper surface 209 of the platinum layer 208 can be damaged during pattern etching of the titanium and titanium nitride layers 206, 204, creating a rough surface 209 on the platinum 208. The roughened platinum surface 209 can create problems during the subsequent deposition of a high dielectric constant material. Because deposition of the high dielectric constant material 212 is conformal, as shown in FIG. 2E, the surface 213 of the deposited high dielectric constant material 212 takes on the atypical morphology of the underlying platinum surface 209. This can lead to increased current leakage in the final semiconductor device.

Therefore, it would be desirable to provide a mask material for use in the etching of platinum which can be easily removed without damaging either the platinum or an underlying doped substrate material, and which can protect the platinum surface during the etching of underlying material layers.

SUMMARY OF THE INVENTION

Applicants have discovered that silicon carbide can be used as a hard mask for etching platinum and can be easily removed without damaging either the platinum or an underlying doped substrate material. As such, the silicon carbide mask layer can remain in place and protect the platinum surface during etching of a number of different underlying material layers. Further, silicon carbide can be deposited and patterned using standard industry techniques. Applicants have also discovered a particular etch chemistry for etching platinum using a silicon carbide hard mask which selectively etches platinum relative to the silicon carbide mask, while providing a vertical (i.e., 80°–90°) platinum etch profile.

Accordingly, a method of pattern etching a platinum layer comprises the steps of: a) providing an etch stack including a patterned silicon carbide layer overlying a layer of platinum; and b) pattern etching the platinum layer using a plasma generated from a source gas comprising $Cl_2$, $BCl_3$, and a nonreactive, diluent gas.

Silicon carbide remaining after etching the platinum layer is subsequently removed by dry etching using a plasma which is selective to etching the silicon carbide relative to other exposed materials. The residual silicon carbide masking material may be removed in many instances using a plasma generated from a source gas consisting essentially of $Cl_2$, with the substrate at a low bias power, such as self-bias or at a low bias voltage in the range of about 100 V or less.

The present disclosure further includes methods of forming semiconductor structures useful in DRAM and FeRAM cells. One such method comprises the steps of: a) providing an etch stack including, from top to bottom, a patterned silicon carbide layer, a layer of platinum, a diffusion barrier layer, a wetting layer, and a layer of a doped dielectric material, overlying a semiconductor substrate; b) pattern etching the platinum layer using a plasma generated from a source gas comprising $Cl_2$, $BCl_3$, and a nonreactive, diluent gas; c) pattern etching the diffusion barrier layer and wetting layer to expose an upper surface of the doped dielectric material layer; and d) removing the silicon carbide layer.

An alternative embodiment of applicants' method comprises the steps of: a) providing an etch stack including, from top to bottom, a patterned silicon carbide layer, a patterned layer which serves as a barrier to the passage of hydrogen, a layer of platinum, a layer of iridium oxide, a layer of iridium, a diffusion barrier layer, a wetting layer, and a layer of a doped dielectric material, overlying a semiconductor substrate; b) pattern etching the platinum layer using a plasma generated from a source gas comprising $Cl_2$, $BCl_3$, and a nonreactive, diluent gas; c) pattern etching the iridium oxide layer and iridium layer; d) pattern etching the diffusion barrier layer and wetting layer to expose an upper surface of the doped dielectric layer; e) removing the silicon carbide layer; and f) removing the barrier layer to hydrogen.

Yet another embodiment of applicants' method comprises the steps of: a) providing an etch stack including, from top to bottom, a patterned silicon carbide layer, a patterned layer which serves as a barrier to the passage of hydrogen, a layer of platinum, a layer of iridium oxide, a layer of iridium, a diffusion barrier layer, a wetting layer, and a layer of a doped dielectric material, overlying a semiconductor substrate; b) pattern etching the platinum layer using a plasma generated from a source gas comprising $Cl_2$, $BCl_3$, and a nonreactive, diluent gas; c) pattern etching the iridium oxide layer and iridium layer; d) removing the silicon carbide layer; and e) simultaneously removing the barrier layer to hydrogen and pattern etching the diffusion barrier layer and wetting layer, to expose an upper surface of the doped dielectric material layer.

DETAILED DESCRIPTION OF EXEMPLARY EMBODIMENTS

Disclosed herein is a method for etching platinum using a silicon carbide mask. Also disclosed herein are methods of forming various semiconductor structures useful in the preparation of DRAM and FeRAM cells. Exemplary processing conditions for performing the methods of the invention are set forth below.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment example etch processes described herein were carried out in a CENTURA® Integrated Processing System available from Applied Materials, Inc., of Santa Clara, Calif. This apparatus is described in detail below; however, it is contemplated that other apparatus known in the industry may be used to carry out the invention.

Figure 1A:
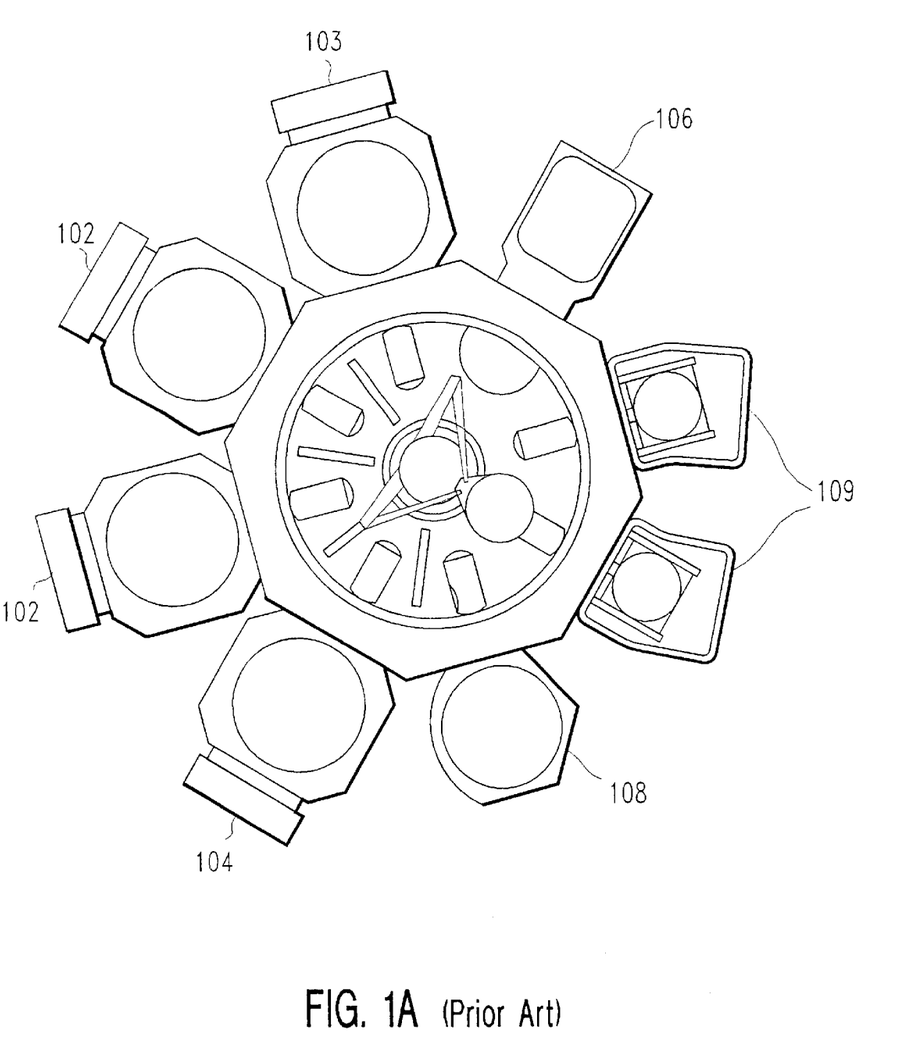
FIG. 1A shows a schematic of a multi-chambered semiconductor processing system of the kind which can be used to carry out the processes described herein.

FIG. 1A shows an elevation schematic of the CENTURA® Integrated Processing System. The CENTURA® Integrated Processing System is a fully automated semiconductor fabrication system, employing a single-wafer, multi-chamber, modular design which accommodates 200-mm or 300-mm wafers. For example, as shown in FIG. 1A, the CENTURA® etch system may include decoupled plasma source (DPS) etch chambers 102; deposition chamber 103; advanced strip-and-passivation (ASP) chamber 104; wafer orienter chamber 106; cooldown chamber 108; and independently operated loadlock chambers 109.

Figure 1B:
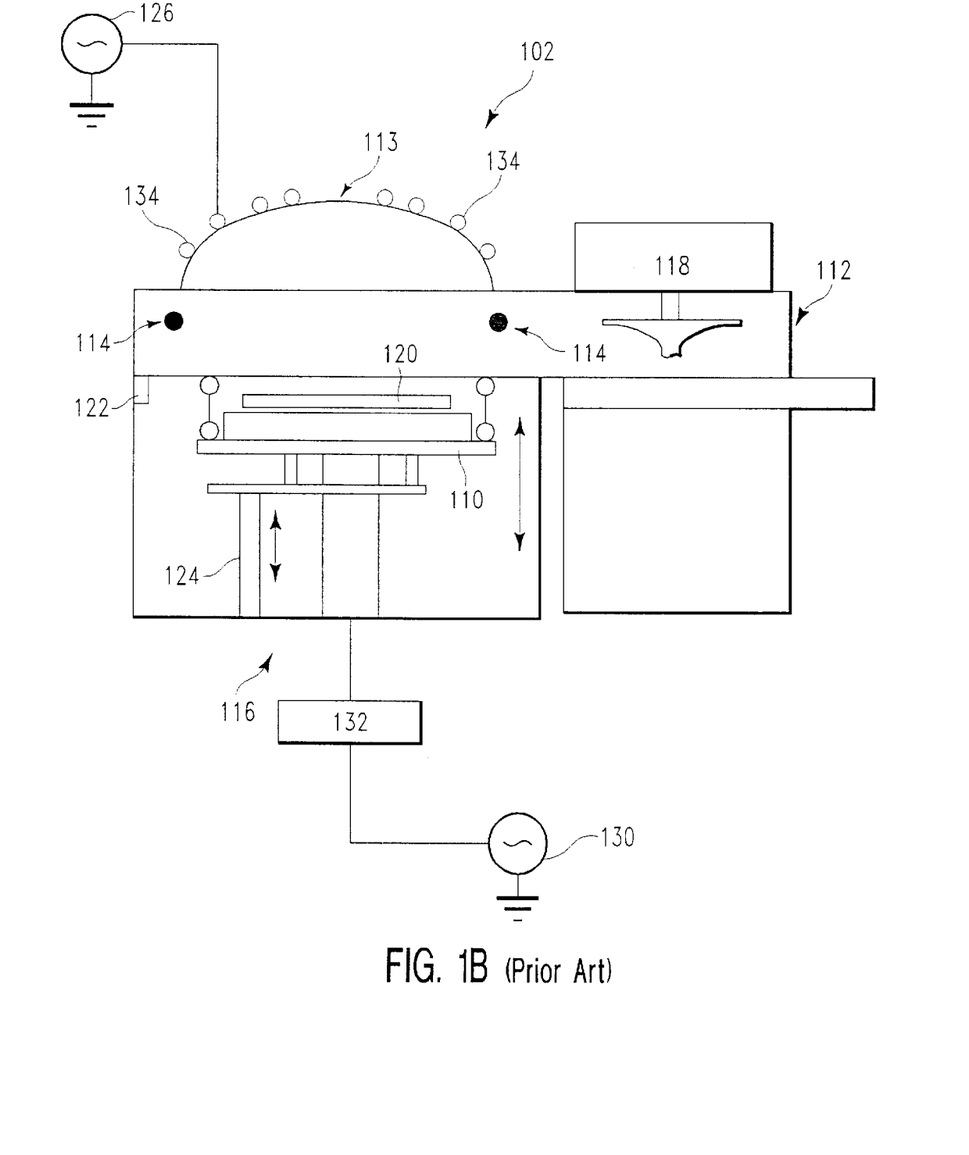
FIG. 1B shows a schematic of a cross-sectional view of a plasma etch chamber of the kind which can be used to carry out the etching processes described herein.

FIG. 1B is a schematic of an individual CENTURA® DPS™ etch chamber 102 of the type which may be used in the Applied Materials' CENTURA® Integrated Processing System. The equipment shown in schematic in FIG. 1B includes a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96–12, pp. 222–233 (1996). The CENTURA® DPS™ etch chamber 100 is configured to be mounted on a standard CENTURA® mainframe.

The CENTURA® DPS™ etch chamber 102 consists of an upper chamber 112 having a ceramic dome 113, and a lower chamber 116. The lower chamber 116 includes an electrostatic chuck (ESC) cathode 110. Gas is introduced into the chamber via gas injection nozzles 114 for uniform gas distribution. Chamber pressure is controlled by a closed-loop pressure control system (not shown) with a throttle valve 118. During processing, a substrate 120 is introduced into the lower chamber 116 through inlet 122. The substrate 120 is held in place by means of a static charge generated on the surface of electrostatic chuck (ESC) cathode 110 by applying a DC voltage to a conductive layer located under a dielectric film on the chuck surface. The cathode 110 and substrate 120 are then raised by means of a wafer lift 124 and a seal is created against the upper chamber 112 in position for processing. Etch gases are introduced into the upper chamber 112 via the ceramic gas injection nozzles 114. The etch chamber 102 uses an inductively coupled plasma source power 126 operating at 2 MHz, which is connected to inductive coil 134 for generating and sustaining a high density plasma. The wafer is biased with an RF source 130 and matching network 132 operating at 13.56 MHz. Power to the plasma source 126 and substrate biasing means 130 are controlled by separate controllers (not shown).

The temperature on the surface of the etch chamber walls is controlled using liquid-containing conduits (not shown) which are located in the walls of the etch chamber 102. The temperature of the semiconductor substrate is controlled using the temperature of the electrostatic chuck cathode 110 upon which the substrate 120 rests. Typically, a helium gas flow is used to facilitate heat transfer between the substrate and the pedestal.

When the end point of an etch is signaled by the etch reaching an interface with a different material, an endpoint subsystem (not shown) senses the end of the etch process by monitoring changes in the spectrum emitted by the plasma in the etch chamber 102. Data is then displayed on a PC monitor. The operator sets an algorithm which controls the endpoint subsystem using optical emission spectroscopy (OES).

As previously mentioned, although the etch process chamber used to process the substrates described in the Examples presented herein is shown in schematic in FIG. 1B, any of the etch processors available in the industry should be able to take advantage of the etch chemistry described herein, with some adjustment to other process parameters.

Figure 3A:
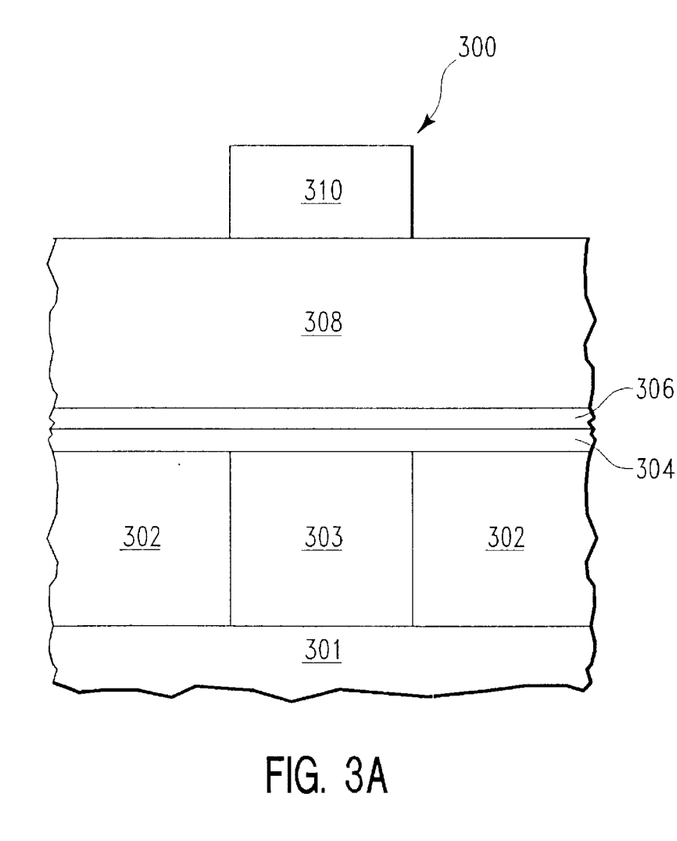
FIGS. 3A–3D illustrate an exemplary embodiment of the method of the invention for forming a semiconductor structure 300 useful in the formation of a DRAM cell.

II. Exemplary Method of the Invention for Etching Platinum Using a Silicon Carbide Mask FIGS. 3A–3D illustrate an exemplary embodiment of the method of the invention for forming a semiconductor structure 300 useful in the formation of a DRAM cell. FIG. 3A shows a typical starting structure 300, which includes, from bottom to top, a semiconductor substrate 301, a doped premetal dielectric (PMD) layer 302, a wetting layer 304, a diffusion barrier layer 306, a layer 308 of platinum, and a patterned silicon carbide mask layer 310. The various layers of structure 300 can be deposited using conventional deposition techniques known in the art.

The doped PMD layer 302 typically comprises a heavily doped dielectric material, such as, for example, a doped glass, such as borophosphosilicate glass (BPSG), borosilicate glass (BSG), or phosophosilicate glass (PSG). The dopant may be present in the depositing material. For example, BPSG is typically deposited using chemical vapor deposition (CVD) techniques, and then reflowed at a temperature greater than about 800° C. Alternatively, doping of PMD layer 302 may be performed using conventional ion implantation techniques known in the art. A tungsten plug 303 has previously been formed in PMD layer 302 using techniques known in the art.

Overlying doped PMD layer 302 is a wetting layer 304. The purpose of wetting layer 304 is to improve the adhesion of the diffusion barrier layer 306 to the underlying tungsten plug 303. The wetting layer 304 typically comprises a material selected from the group consisting of titanium or tantalum, by way of example and not by way of limitation. The wetting layer is typically deposited by PVD (physical vapor deposition ) or CVD techniques. The thickness of the wetting layer 304 will depend on the particular wetting layer material selected. For example, when the wetting layer comprises Ti, the wetting layer 304 will typically be a sputtered layer having a thickness within the range of about 50 Å to about 500 Å.

Overlying wetting layer 304 is a diffusion barrier layer 306. The purpose of diffusion barrier layer 306 is to prevent the diffusion and migration of molecules from the underlying semiconductor substrate 301 and/or the doped PMD layer 302 into the overlying platinum layer 308. The diffusion barrier layer 306 typically comprises a material selected from the group consisting of titanium nitride (TiN), tantalum nitride (TaN), titanium aluminum nitride (TiAlN), or tantalum silicon nitride (TaSiN), by way of example and not by way of limitation. When the wetting layer 304 is titanium, the diffusion barrier layer 306 is frequently titanium nitride, which is applied by reactive sputtering in the same process chamber in which the titanium wetting layer is applied. The thickness of the diffusion barrier layer 306 will depend on the particular diffusion barrier layer material selected. For example, when the diffusion barrier layer comprises TiN, the diffusion barrier layer 306 will typically have a thickness within the range of about 200 Å to about 1000 Å.

Overlying diffusion barrier layer 306 is platinum layer 308. Platinum layer 308 is typically deposited by PVD or CVD to have a thickness within the range of about 500 Å to about 4000 Å. The thickness of the platinum layer will depend on the particular end use application of the semiconductor device being produced.

Overlying platinum layer 308 is a silicon carbide mask layer 310. The silicon carbide mask layer 310 is typically deposited using a CVD or plasma-enhanced CVD (PECVD) process using reactant gases such as silane/methane/argon, silane/methane/hydrogen, or silane/propane/hydrogen, by way of example, and not by way of limitation.

The silicon carbide layer 310 typically has a thickness within the range of about 2000 Å to about 8000 Å. The desired thickness of the silicon carbide layer 310 will be determined by the total thickness of the underlying layers to be etched using the silicon carbide layer as a mask, as well as the selectivity of the particular etchant gases and processing conditions used for etching the underlying layers relative to silicon carbide. As used herein, the term "selectivity" or "etch selectivity" refers to a ratio of the etch rate of a first material to the etch rate of a second material, using a given plasma source gas and processing conditions. In this case, the selectivity is that of the platinum layer 308 relative to the silicon carbide mask layer 310. The higher the selectivity for etching platinum relative to silicon carbide, the thinner the layer of silicon carbide can be. Typically, the ratio of the thickness of the silicon carbide layer 310 to the thickness of the underlying platinum layer 308 is within the range of about 2:1 to about 4:1.

The silicon carbide layer 310, illustrated in FIG. 3A, has been previously patterned, typically using a photoresist, according to techniques known in the art. The photoresist may be any suitable photoresist material known in the art, and is typically an organic, carbon-containing material. Frequently, a deep ultra-violet (DUV) photoresist is used to transfer a pattern to a substrate. DUV photoresists are available from either JSR® (Tokyo, Japan) or SHIPLEY®, INC. (Marlboro, Mass.), for example, and not by way of limitation. Residual photoresist remaining after patterning of silicon carbide layer 310 should be removed prior to performing subsequent etching steps. Removal of the photoresist may be performed in accordance with the manufacturer's instructions. Frequently, a downstream $O_2$ plasma is used to remove the organic photoresist.

Figure 3B:
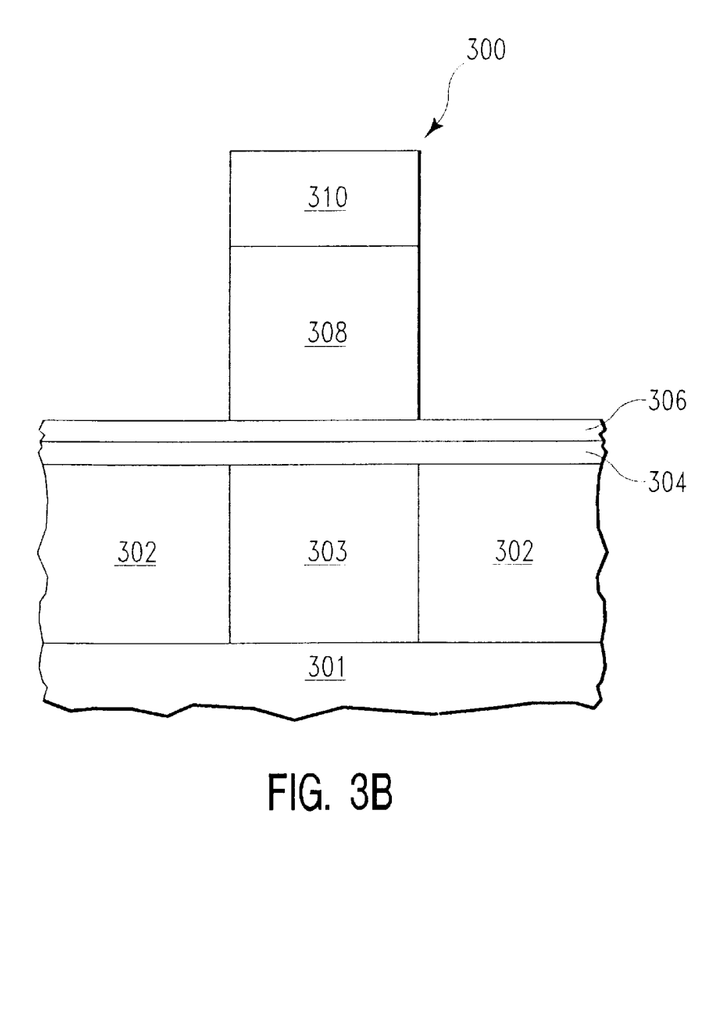

Referring to FIG. 3B, the platinum layer 308 is pattern etched, according to the method of the invention, using a plasma generated from a source gas comprising $Cl_2$, $BCl_3$, and a nonreactive, diluent gas. Boron trichloride ($BCl_3$) serves as an etchant for platinum, while also providing sidewall passivation of the silicon carbide mask 310, protecting the mask and minimizing mask erosion during etching of the underlying platinum layer 308.

The nonreactive, diluent gas is typically a noble gas selected from the group consisting of argon, helium, xenon, krypton, and combinations thereof. The plasma source gas may optionally also include $N_2$.

Table One, below, provides typical process conditions for etching of platinum using a plasma source gas comprising $Cl_2$, $BCl_3$, argon and, optionally, nitrogen, according to the method of the invention.

TABLE ONE

Process Conditions for Plasma Etching of Platinum

| Process Parameter | Range of Process Conditions | Typical Process Conditions | Optimum Known Process Conditions |
|---|---|---|---|
| $Cl_2$ Flow Rate (sccm) | 0–200 | 80–160 | 100–140 |
| $BCl_3$ Flow Rate (sccm) | 10–100* | 10–50 | 10–20 |
| Ar Flow Rate (sccm) | 0–100 | 80–160 | 20–40 |
| $N_2$ Flow Rate (sccm) | 0–100 | 0–50 | 0–20 |
| Total Gas Flow Rate (sccm) | 20–200 | 100–200 | 150–200 |
| Plasma Source Power (W) | 100–1500 | 800–1200 | 800–1000 |
| Substrate Bias Power (W) | 100–500 | 200–400 | 250–300 |
| Process Chamber Pressure (mTorr) | 2–50 | 20–40 | 30–40 |
| Substrate Temperature (° C.) | 200–400 | 250–400 | 300–350 |

*When $BCl_3$ provides the sole etchant species, it is necessary to include, in the plasma source gas, a gas (such as $N_2$, $NH_3$) which enhances the dissociation of $BCl_3$ into active chlorine species.

Plasma etching of platinum according to the method of the invention, using $Cl_2/BCl_3/Ar$ etch chemistry and the above process conditions, provides passivation of the silicon carbide mask sidewall, adequate ion energy to sputter the film surface, and adequate chlorine radicals to chemically react with the sputtered platinum atoms to form $PtCl_4$ and other volatile byproducts.

Figure 3C:
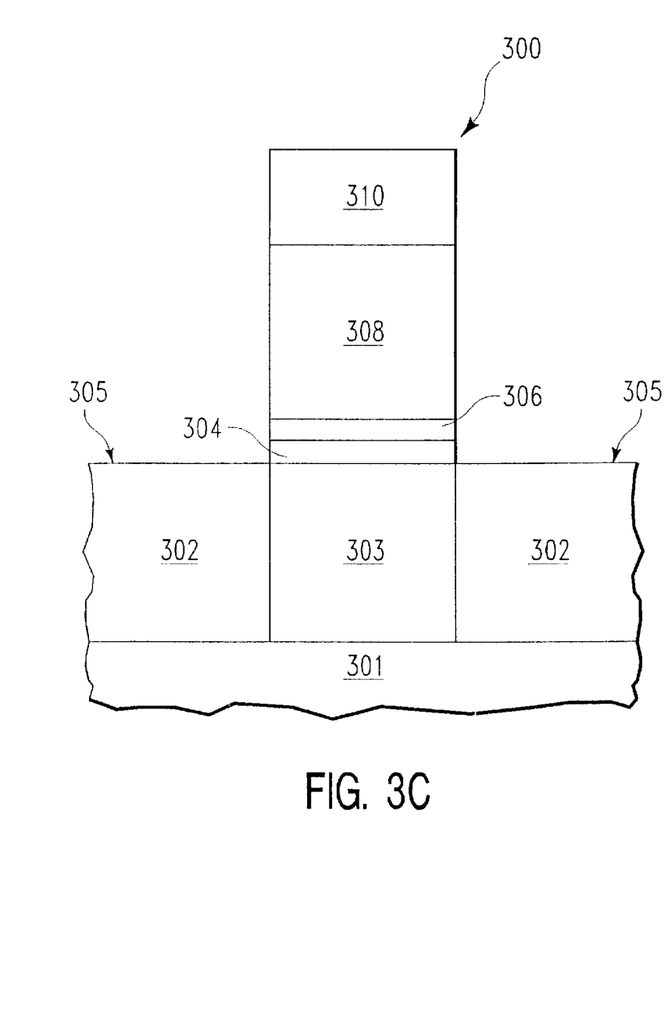

Referring to FIG. 3C, the diffusion barrier layer 306 and wetting layer 304 are then pattern etched, to expose a portion of an upper surface 305 of doped PMD layer 302. If the diffusion barrier layer 306 comprises TiN and the wetting layer 304 comprises Ti, pattern etching is typically performed using a plasma generated from a source gas comprising $Cl_2$ and a nonreactive, diluent gas selected from the group consisting of argon, helium, xenon, krypton, and combinations thereof. The following plasma source gas and processing conditions have been shown to provide good results: 120 sccm $Cl_2$; 30 sccm Ar; 20 mTorr process chamber pressure; 1500 W plasma source power; 50 W substrate bias power; and 320° C. substrate temperature.

Typically, the diffusion barrier layer 306 and wetting layer 304 are etched in a single etching step, using the same plasma source gas and processing conditions. Alternatively, depending on the particular diffusion barrier layer and wetting layer materials used, the diffusion barrier layer 306 and wetting layer 304 may be etched in two separate etching steps, using different plasma source gases and processing conditions.

Figure 3D:
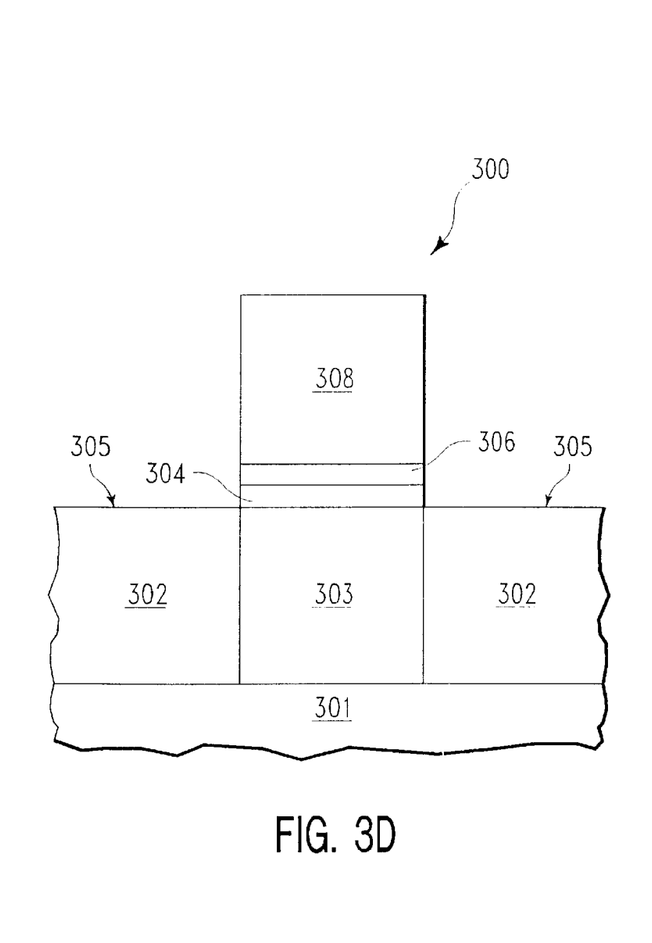

Referring to FIG. 3D, the remaining silicon carbide mask layer 310 is then removed by plasma etching using $Cl_2$. Table Two, below, provides typical process conditions for removal of the silicon carbide mask layer 310.

TABLE TWO

Process Conditions for Plasma Etching of Silicon Carbide

| Process Parameter | Range of Process Conditions | Typical Process Conditions | Optimum Known Process Conditions |
|---|---|---|---|
| $Cl_2$ Flow Rate (sccm) | 5–200 | 80–160 | 100–140 |
| Plasma Source Power (W) | 100–1600 | 1200–1600 | 1400–1600 |
| Substrate Bias Power (W) | 0–100 | 40–60 | 45–55 |
| Process Chamber Pressure (mTorr) | 5–50 | 15–25 | 10–30 |
| Substrate Temperature (° C.) | 15–400 | 250–350 | 300–340 |

Removal of the silicon carbide layer 310 is typically performed using a relatively high plasma source power (about 1200 W to about 1600 W) and a low substrate bias power (about 40 W to about 60 W). The $Cl_2$ chemistry and above process conditions provide excellent selectivity (ie., at least 10:1) for etching the silicon carbide relative to the doped PMD layer 302, while avoiding damage to the exposed platinum layer 308. Removal of the silicon carbide layer 310 using the above processing conditions provides a clean post-etch profile and minimum erosion of platinum layer 308.

Performance of the method of the invention using the processing conditions set forth above for etching of a platinum layer 308 and removal of an overlying silicon carbide mask layer 310 typically provides a platinum etch profile angle within the range of about 75° to about 90°.

Further processing steps, such as deposition of an overlying dielectric material layer, can now be performed, according to techniques known in the art, to form a DRAM structure.

Figure 4A:
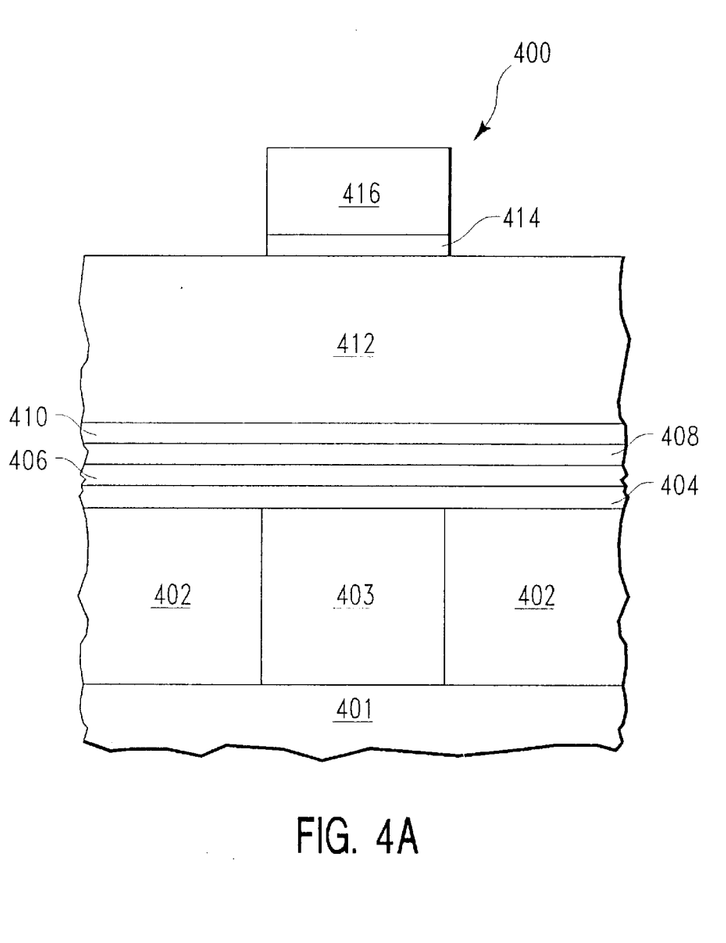
FIGS. 4A–4F illustrate an exemplary embodiment of the method of the invention for forming a semiconductor structure 400 useful in the formation of an FeRAM cell.

FIGS. 4A–4F illustrate an exemplary embodiment of the method of the invention for forming a semiconductor structure 400 useful in the formation of an FeRAM cell. FIG. 4A shows a typical starting structure 400, which includes, from bottom to top, a semiconductor substrate 401, a doped PMD layer 402, a wetting layer 404, a diffusion barrier layer 406, a layer 408 of iridium, a layer 410 of iridium oxide, a layer 412 of platinum, a patterned layer 414 which serves as a barrier to the passage of hydrogen, and a patterned silicon carbide mask layer 416. A tungsten plug 403 has been previously formed in doped PMD layer 402 using techniques known in the art.

The structure 400 shown in FIG. 4A is similar to the starting structure 300 illustrated in FIG. 3A, with the exception that structure 400 additionally includes iridium layer 408 and iridium oxide layer 410 between diffusion barrier layer 406 and platinum layer 410. In addition, to protect the iridium oxide layer 410 from deoxidation, it is necessary to provide a layer 414, which serves as a barrier to the passage of hydrogen, between platinum layer 412 and patterned silicon carbide mask layer 416.

Structure 400 can be formed using techniques known in the art, such as the methods and materials discussed above with respect to the formation of the various layers in semiconductor structure 300. Referring back to FIG. 4A, overlying diffusion barrier layer 406 is iridium layer 408, which is typically deposited by PVD, using argon gas, to have a thickness within the range of about 500 Å to about 2000 Å. Overlying iridium layer 408 is iridium oxide layer 410, which is typically deposited by PVD, using $O_2$ gas, to have a thickness within the range of about 200 Å to about 1000 Å.

As discussed above with respect to the formation of the various layers in structure 300 (shown in FIG. 3A), the silicon carbide mask layer is deposited using a hydrogen-rich, silane-based deposition process. During deposition of the silicon carbide layer 416, free hydrogen can diffuse through platinum layer 412 to underlying iridium oxide layer 410. Reaction of hydrogen with oxygen from iridium oxide layer 410 results in the formation of water at the interface between iridium oxide layer 410 and iridium layer 408, causing iridium oxide layer 410 to separate from iridium layer 408. In addition to creating a structure which cannot be processed further into a final semiconductor device, separation of iridium oxide layer 410 and overlying layers from the semiconductor substrate 402 results in massive deposition of flaked-off iridium compounds and overlying materials over interior surfaces of the semiconductor processing chamber.

In order to prevent the diffusion of hydrogen through platinum layer 412 to iridium oxide layer 410 during deposition of silicon carbide mask layer 416, it is necessary to provide a layer 414 of a material, which serves as a barrier to the passage of hydrogen, between silicon carbide layer 416 and platinum layer 412. This barrier layer 414 to hydrogen also serves as an additional mask layer during subsequent pattern etching of platinum layer 412.

Barrier layer 414 may comprise any material which serves as a physical or chemical barrier to hydrogen diffusion. Typically, hydrogen barrier layer comprises a material selected from the group consisting of alumina ($Al_2O_3$), titanium oxide ($TiO_2$), and combinations thereof, by way of example and not by way of limitation. The method of depositing the hydrogen barrier layer 414 will depend on the particular hydrogen barrier material used. The thickness of hydrogen barrier layer 414 will depend on the particular hydrogen barrier material used and its relative resistance to hydrogen diffusion (i.e., a material which is known to have a high resistance to hydrogen diffusion will require a smaller thickness than a material which is known to have a lesser resistance to hydrogen diffusion). For example, when hydrogen barrier layer 414 comprises alumina, the hydrogen barrier layer is typically deposited by PVD to have a thickness within the range of about 50 Å to about 200 Å.

Silicon carbide layer 416 and hydrogen barrier layer 414 have been previously patterned prior to performing the method of the invention. Silicon carbide layer 416 can be patterned as described above, with respect to the formation of semiconductor structure 300 shown in FIG. 3A. Hydrogen barrier layer 414 can be patterned at the same time as silicon carbide layer 416, prior to removal of the photoresist. Alternatively, hydrogen barrier layer 414 can be patterned in a separate patterning step, after removal of the photoresist, using patterned silicon carbide layer 416 as a patterning mask. The particular patterning method for the hydrogen barrier layer 414 will depend on the barrier material used.

Figure 4B:
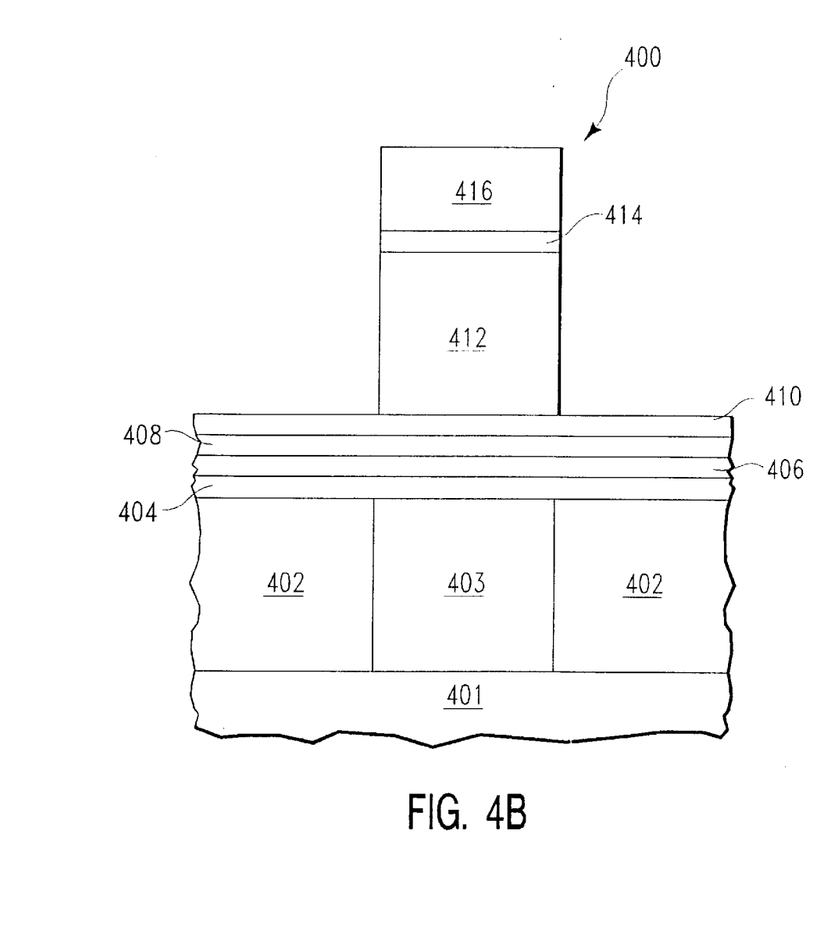

Referring to FIG. 4B, the platinum layer 412 is pattern etched, according to the method of the invention, using a plasma generated from a source gas comprising $Cl_2$, $BCl_3$, and a nonreactive, diluent gas, using the processing conditions provided in Table One, above.

Figure 4C:
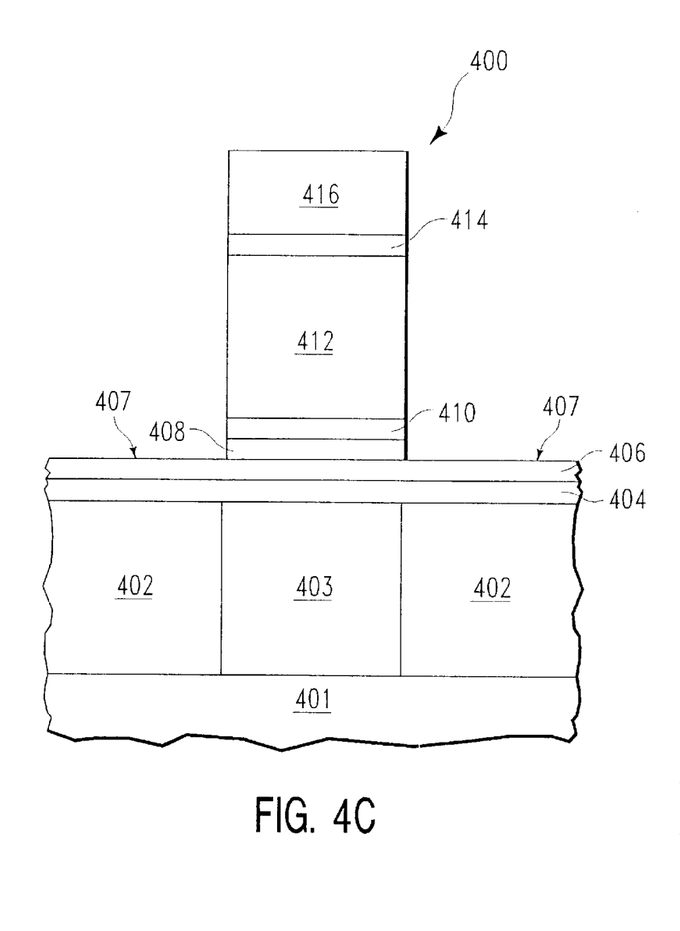

Referring to FIG. 4C, iridium oxide layer 410 and iridium layer 408 are then pattern etched, to expose a portion of an upper surface 407 of diffusion barrier layer 406. Pattern etching is typically performed using a plasma generated from a source gas comprising $Cl_2$, $O_2$, and a nonreactive, diluent gas selected from the group consisting of argon, helium, xenon, krypton, and combinations thereof. The following plasma source gas and processing conditions have been shown to provide good results: 100 sccm $Cl_2$; 50 sccm $O_2$; 15 sccm Ar; 10 mTorr process chamber pressure; 1000 W plasma source power; 500 W substrate bias power; and 320° C. substrate temperature. Typically, iridium oxide layer 410 and iridium layer 408 are etched in a single etching step, using the same plasma source gas and processing conditions.

Figure 4D:
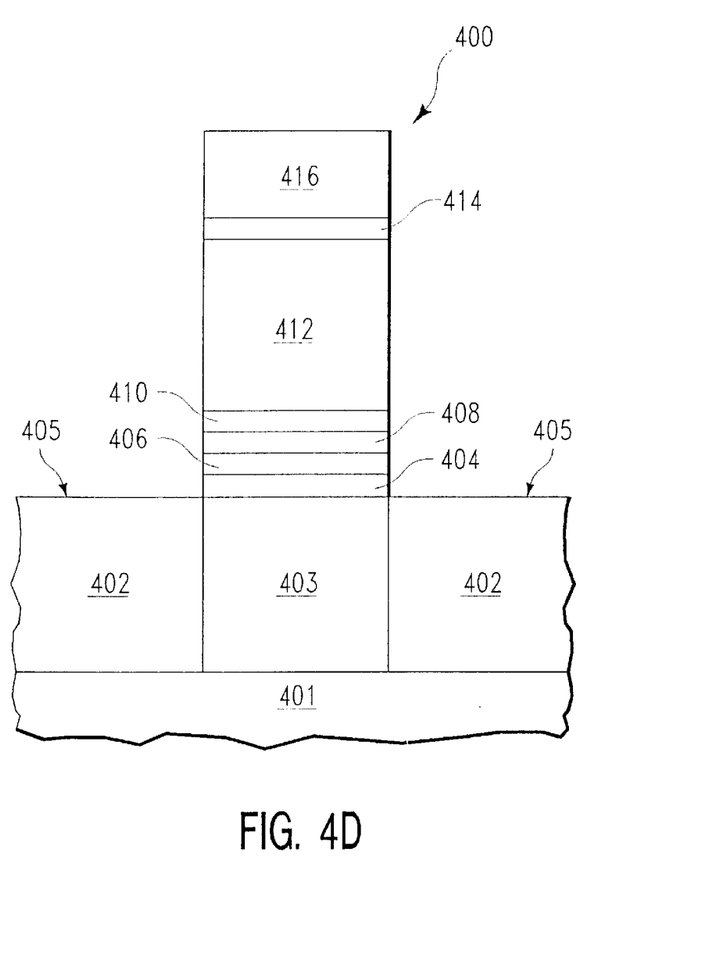

Referring to FIG. 4D, the diffusion barrier layer 406 and wetting layer 404 are then pattern etched, to expose a portion of an upper surface 405 of doped PMD layer 402. If the diffusion barrier layer 406 comprises TiN and the wetting layer 404 comprises Ti, pattern etching is typically performed using a plasma generated from a source gas comprising $Cl_2$ and a nonreactive, diluent gas selected from the group consisting of argon, helium, xenon, krypton, and combinations thereof. The following plasma source gas and processing conditions have been shown to provide good results: 120 sccm $Cl_2$; 30 sccm Ar; 20 mTorr process chamber pressure; 1500 W plasma source power; 50 W substrate bias power; and 320° C. substrate temperature.

Typically, the diffusion barrier layer 406 and wetting layer 404 are etched in a single etching step, using the same plasma source gas and processing conditions. Alternatively, depending on the particular diffusion barrier layer and wetting layer materials used, the diffusion barrier layer 406 and wetting layer 404 may be etched in two separate etching steps, using different plasma source gases and processing conditions.

Figure 4E:
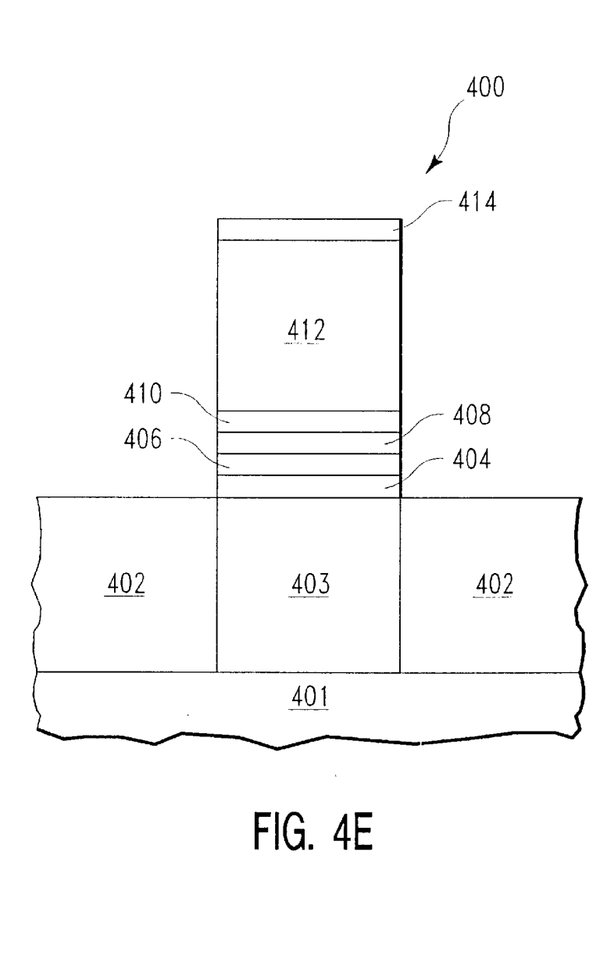

Referring to FIG. 4E, the remaining silicon carbide mask layer 416 is then removed by plasma etching using $Cl_2$, using the processing conditions provided in Table Two, above.

Figure 4F:
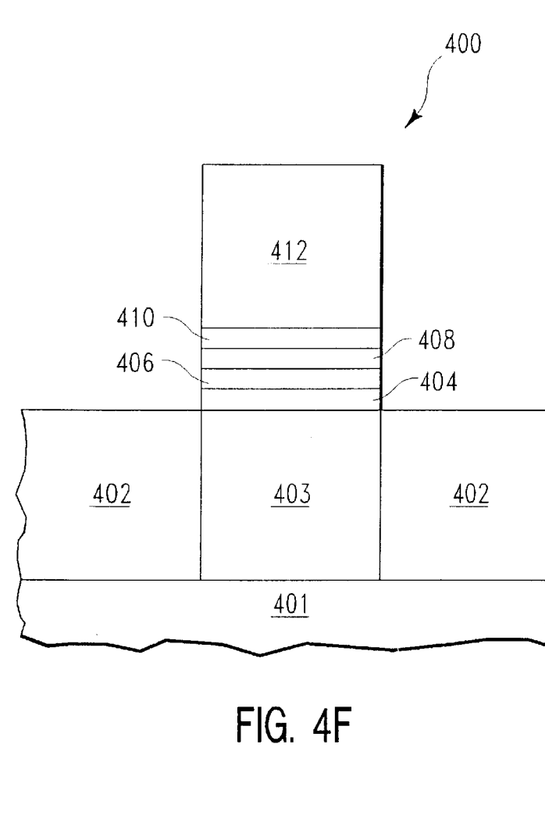

Referring to FIG. 4F, the barrier layer 414 to hydrogen is then removed. Depending on the particular material used, barrier layer 414 may be removed at the same time that the residual silicon carbide layer 416 is removed. Alternatively, the barrier layer 414 to hydrogen may be removed in a separate etching step. For example, if the barrier layer comprises alumina or titanium oxide, the following plasma source gas and processing conditions can be used: 120 sccm $Cl_2$; 15 sccm $BCl_3$; 30 sccm Ar; 36 mTorr process chamber pressure; 900 W plasma source power; 275 W substrate bias power; and 320° C. substrate temperature.

Further processing steps, such as deposition of an overlying high dielectric constant material layer, can now be performed, according to techniques known in the art, to form an FeRAM structure.

Figure 5A:
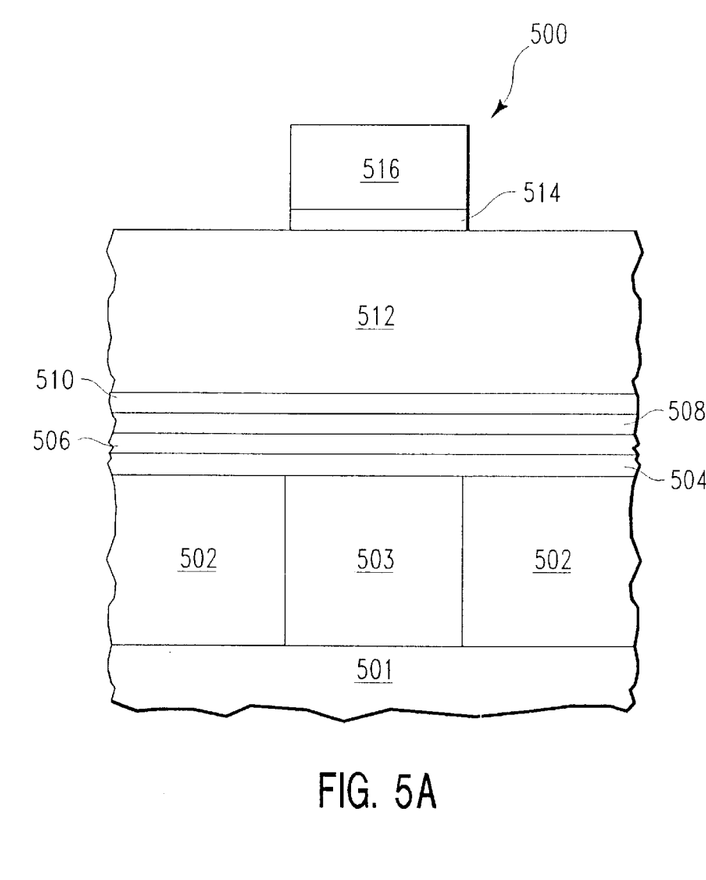
FIGS. 5A–5E illustrate an alternative embodiment of the method of the invention for forming a semiconductor structure 500 useful in the formation of an FeRAM cell.

FIGS. 5A–5E illustrate an alternative process integration scheme for forming a semiconductor structure 500 useful in the formation of an FeRAM cell. FIG. 5A shows a typical starting structure 500, which includes, from bottom to top, a semiconductor substrate 501, a doped PMD layer 502, a wetting layer 504, a diffusion barrier layer 506, a layer 508 of iridium, a layer 510 of iridium oxide, a layer 512 of platinum, a patterned layer 514 which serves as a barrier to the passage of hydrogen, and a patterned silicon carbide mask layer 516. A tungsten plug 503 has been previously formed in doped PMD layer 502 using techniques known in the art.

The structure 500 shown in FIG. 5A is identical to the starting structure 400 illustrated in FIG. 4A, and can be formed using the methods and materials discussed above with respect to the formation of the various layers in semiconductor structure 400.

Figure 5B:
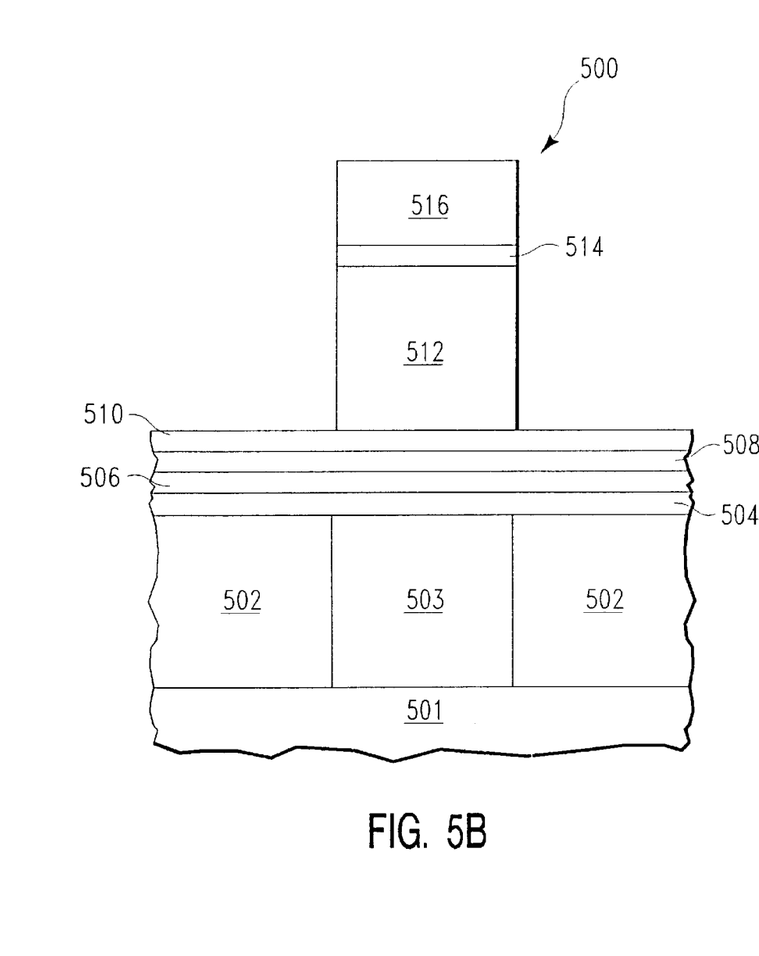
Figure 5C:
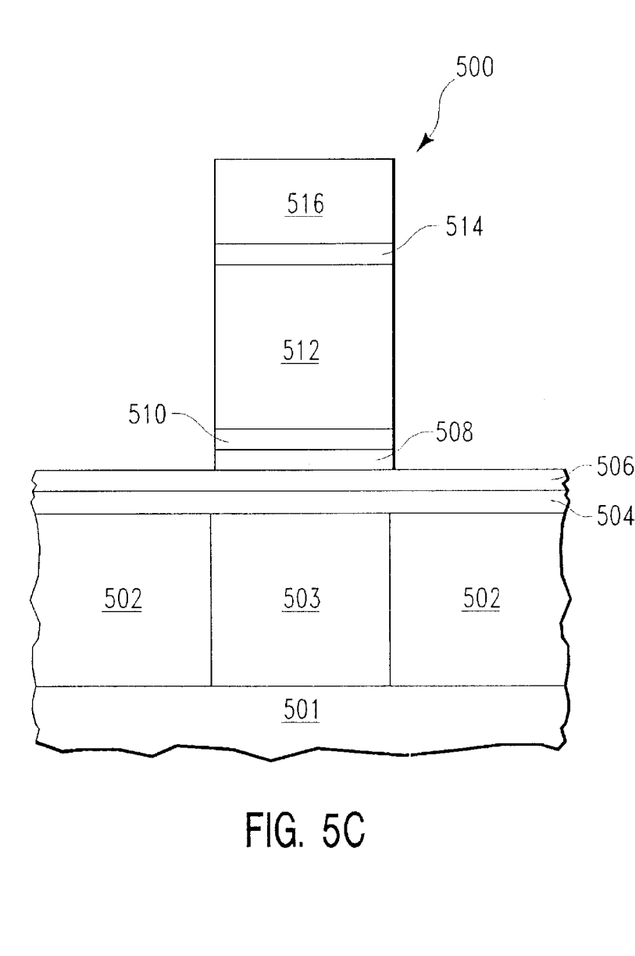

The structures 500 shown in FIGS. 5B and 5C are identical to those shown in FIGS. 4B and 4C, respectively. The first two steps of the present embodiment are identical to the first two steps of the previously described method for forming a structure useful in an FeRAM cell. Referring to FIGS. 5B and 5C, the platinum layer 512, iridium oxide layer 510, and iridium layer 508 are pattern etched, as discussed above with respect to FIGS. 4B and 4C.

Figure 5D:
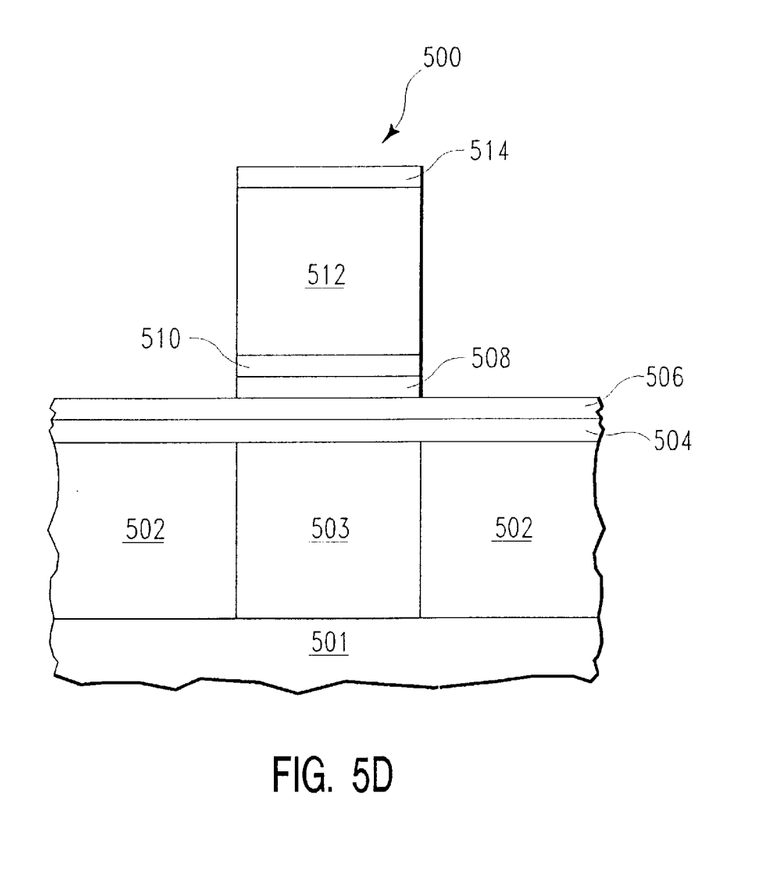

Referring to FIG. 5D, the silicon carbide mask layer 516 is removed by plasma etching using $Cl_2$, using the processing conditions provided in Table Two, above.

Figure 5E:
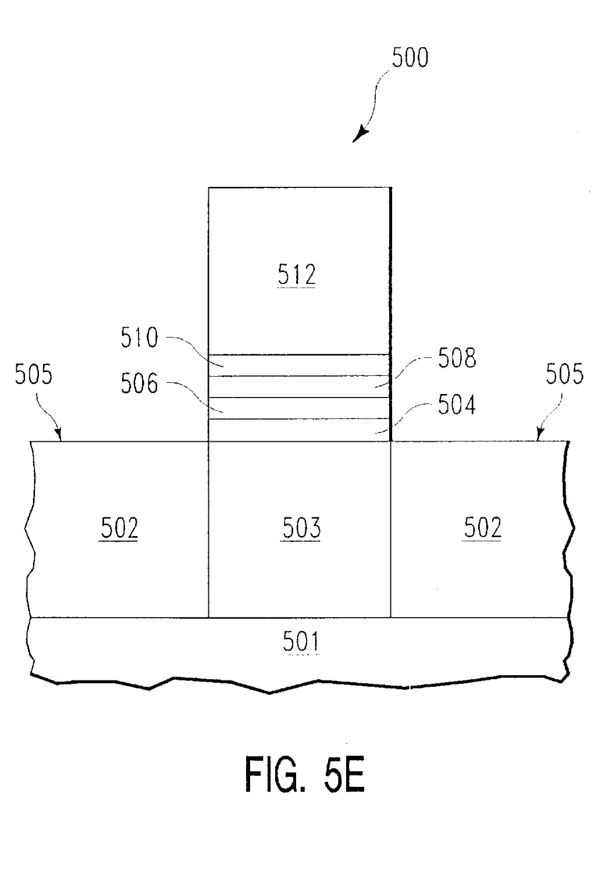

Referring to FIG. 5E, the diffusion barrier layer 506 and wetting layer 504 are pattern etched, to expose a portion of an upper surface 505 of doped PMD layer 502. The barrier layer 514 to hydrogen is removed simultaneously with etching of the diffusion barrier and wetting layers 506, 504. If the barrier layer 514 to hydrogen comprises alumina or titanium oxide, the diffusion barrier layer 506 comprises titanium nitride, and the wetting layer 504 comprises titanium, etching is typically performed using a plasma generated from a source gas comprising chlorine and argon. The following plasma source gas and processing conditions have been shown to provide good results: 120 sccm $Cl_2$; 15 sccm $BCl_3$; 30 sccm Ar; 36 mTorr process chamber pressure; 900 W plasma source power; 275 W substrate bias power; and 320° C. substrate temperature.

Further processing steps, such as deposition of an overlying high dielectric constant material layer, can now be performed, according to techniques known in the art, to form an FeRAM structure.

The method of the invention for etching platinum using a silicon carbide hard mask provides a smooth platinum etch profile and an etch profile angle of about 75° to about 90°. The silicon carbide mask can be deposited and patterned using standard industry techniques, and can be easily removed without damaging either the platinum or an underlying doped substrate material.

The above described exemplary embodiments are not intended to limit the scope of the present invention, as one skilled in the art can, in view of the present disclosure expand such embodiments to correspond with the subject matter of the invention claimed below.

We claim:

1. A method of pattern etching a platinum layer in a semiconductor structure, comprising the steps of:
    a) providing a semiconductor etch stack including a patterned silicon carbide layer overlying a layer of platinum; and
    b) pattern etching said platinum layer using a plasma generated from a source gas comprising $Cl_2$, $BCl_3$, and a nonreactive, diluent gas.

2. The method of claim 1, wherein said nonreactive, diluent gas is a noble gas selected from the group consisting of argon, helium, xenon, krypton, and combinations thereof.

3. The method of claim 2, wherein said nonreactive, diluent gas is argon.

4. The method of claim 3, wherein said $Cl_2$ comprises between about 60 and about 80 volume %, said $BCl_3$ comprises between about 5 and about 20 volume %, and said argon comprises between about 5 and about 20 volume %, of said plasma source gas.

5. The method of claim 4, wherein said $Cl_2$ comprises between about 70 and about 80 volume %, said $BCl_3$ comprises between about 5 and about 10 volume %, and said argon comprises between about 10 and about 20 volume %, of said plasma source gas.

6. The method of claim 3, wherein said plasma source gas further includes $N_2$.

7. The method of claim 6, wherein said $Cl_2$ comprises between about 60 and about 80 volume %, said $BCl_3$ comprises between about 5 and about 20 volume %, said argon comprises between about 5 and about 20 volume %, and said $N_2$ comprises between about 5 and about 20 volume %, of said plasma source gas.

8. The method of claim 7, wherein said $Cl_2$ comprises between about 70 and about 80 volume %, said $BCl_3$ comprises between about 5 and about 10 volume %, said argon comprises between about 10 and about 20 volume %, and said $N_2$ comprises between about 5 and about 10 volume %, of said plasma source gas.

9. A method of forming a semiconductor structure comprising the steps of:
    a) providing an etch stack including, from top to bottom, a patterned silicon carbide layer, a layer of platinum, a barrier layer, a wetting layer, and a layer of a doped dielectric material, overlying a semiconductor substrate;
    b) pattern etching said platinum layer using a plasma generated from a source gas comprising $Cl_2$, $BCl_3$, and a nonreactive, diluent gas,
    c) pattern etching said diffusion barrier layer and said wetting layer to expose a portion of an upper surface of said doped dielectric layer; and
    d) removing said silicon carbide layer.

10. The method of claim 9, wherein said nonreactive, diluent gas is a noble gas selected from the group consisting of argon, helium, xenon, krypton, and combinations thereof.

11. The method of claim 10, wherein said nonreactive, diluent gas is argon, and wherein said $Cl_2$ comprises between about 60 and about 80 volume %, said $BCl_3$ comprises between about 5 and about 20 volume %, and said argon comprises between about 5 and about 20 volume %, of said plasma source gas.

12. The method of claim 9, wherein said plasma source gas further includes $N_2$.

13. The method of claim 9, wherein said diffusion barrier layer comprises a material selected from the group consisting of TiN, TaN, TiAlN, and TaSiN.

14. The method of claim 9, wherein said wetting layer comprises a material selected from the group consisting of titanium and tantalum.

15. The method of claim 9, wherein said diffusion barrier layer comprises TiN and said wetting layer comprises Ti, and wherein said diffusion barrier layer and said wetting layer are etched using a plasma generated from a source gas comprising $Cl_2$ and a nonreactive, diluent gas selected from the group consisting of argon, helium, xenon, krypton, and combinations thereof.

16. The method of claim 9, wherein said silicon carbide layer is removed by plasma etching using a source gas comprising $Cl_2$.

17. The method of claim 9, wherein said doped dielectric material comprises a material selected from the group consisting of borophosphosilicate glass (BPSG), borosilicate glass (BSG), and phosphosilicate glass (PSG).

18. A method of forming a semiconductor structure comprising the steps of:
    a) providing an etch stack including, from top to bottom, a patterned silicon carbide layer, a patterned layer which serves as a barrier to the passage of hydrogen, a layer of platinum, a layer of iridium oxide, a layer of iridium, a barrier layer, a wetting layer, and a layer of a doped dielectric material, overlying a semiconductor substrate;
    b) pattern etching said platinum layer using a plasma generated from a source gas comprising $Cl_2$, $BCl_3$, and a nonreactive, diluent gas,
    c) pattern etching said iridium oxide layer and said iridium layer;
    d) pattern etching said diffusion barrier layer and said wetting layer to expose a portion of an upper surface of said doped dielectric material layer;

e) removing said silicon carbide layer; and f) removing said barrier layer to hydrogen.

19. The method of claim 18, wherein said nonreactive, diluent gas is a noble gas selected from the group consisting of argon, helium, xenon, krypton, and combinations thereof.

20. The method of claim 19, wherein said nonreactive, diluent gas is argon, and wherein said $Cl_2$ comprises between about 60 and about 80 volume %, said $BCl_3$ comprises between about 5 and about 20 volume %, and said argon comprises between about 5 and about 20 volume %, of said plasma source gas.

21. The method of claim 18, wherein said plasma source gas further includes $N_2$.

22. The method of claim 18, wherein said iridium oxide layer and said iridium layer are etched using a plasma generated from a source gas comprising $Cl_2$, $O_2$, and a nonreactive, diluent gas selected from the group consisting of argon, helium, xenon, krypton, and combinations thereof.

23. The method of claim 18, wherein said diffusion barrier layer comprises a material selected from the group consisting of TiN, TaN, TiAlN, and TaSiN.

24. The method of claim 18, wherein said wetting layer comprises a material selected from the group consisting of titanium and tantalum.

25. The method of claim 18, wherein said diffusion barrier layer comprises TiN and said wetting layer comprises Ti, and wherein said diffusion barrier layer and said wetting layer are etched using a plasma generated from a source gas comprising $Cl_2$ and a nonreactive, diluent gas selected from the group consisting of argon, helium, xenon, krypton, and combinations thereof.

26. The method of claim 18, wherein said silicon carbide layer is removed by plasma etching using a source gas comprising $Cl_2$.

27. The method of claim 26, wherein a substrate bias voltage of 100 V or less is applied during plasma etching of said silicon carbide layer.

28. The method of claim 18, wherein said barrier layer to hydrogen comprises a material selected from the group consisting of alumina, titanium oxide, and combinations thereof.

29. The method of claim 27, wherein said barrier layer to hydrogen is removed by etching using a plasma generated from a source gas comprising chlorine and argon.

30. The method of claim 29, wherein said barrier layer to hydrogen is removed by etching using a plasma generated from a source gas comprising $Cl_2$, $BCl_3$, and argon.

31. The method of claim 18, wherein said doped dielectric material comprises a material selected from the group consisting of borophosphosilicate glass (BPSG), borosilicate glass (BSG), and phosphosilicate glass (PSG).

32. A method of forming a semiconductor structure comprising the steps of:

a) providing an etch stack including, from top to bottom, a patterned silicon carbide layer, a patterned layer which serves as a barrier to the passage of hydrogen, a layer of platinum, a layer of iridium oxide, a layer of iridium, a barrier layer, a wetting layer, and a layer of a doped dielectric material, overlying a semiconductor substrate;

b) pattern etching said platinum layer using a plasma generated from a source gas comprising $Cl_2$, $BCl_3$, and a nonreactive, diluent gas;

c) pattern etching said iridium oxide layer and said iridium layer, d) removing said silicon carbide layer; and e) simultaneously removing said barrier layer to hydrogen and pattern etching said diffusion barrier layer and said wetting layer, to expose a portion of an upper surface of said semiconductor substrate.

33. The method of claim 32, wherein said nonreactive, diluent gas is a noble gas selected from the group consisting of argon, helium, xenon, krypton, and combinations thereof.

34. The method of claim 33, wherein said nonreactive, diluent gas is argon, and wherein said $Cl_2$ comprises between about 60 and about 80 volume %, said $BCl_3$ comprises between about 5 and about 20 volume %, and said argon comprises between about 5 and about 20 volume %, of said plasma source gas.

35. The method of claim 32, wherein said plasma source gas further includes $N_2$.

36. The method of claim 32, wherein said iridium oxide layer and said iridium layer are etched using a plasma generated from a source gas comprising $Cl_2$, $O_2$, and a nonreactive, diluent gas selected from the group consisting of argon, helium, xenon, krypton, and combinations thereof.

37. The method of claim 32, wherein said silicon carbide layer is removed by plasma etching using a source gas comprising $Cl_2$.

38. The method of claim 37, wherein a substrate bias voltage of 100 V or less is applied during plasma etching of said silicon carbide layer.

39. The method of claim 32, wherein said diffusion barrier layer comprises a material selected from the group consisting of TiN, TaN, TiAlN, and TaSiN.

40. The method of claim 32, wherein said wetting layer comprises a material selected from the group consisting of titanium and tantalum.

41. The method of claim 32, wherein said barrier layer to hydrogen comprises a material selected from the group consisting of alumina, titanium oxide, and combinations thereof.

42. The method of claim 41, wherein said diffusion barrier layer comprises titanium nitride and said wetting layer comprises titanium, and wherein said barrier layer to hydrogen is removed and said diffusion barrier layer and said wetting layer are etched using a plasma generated from a source gas comprising chlorine.

43. The method of claim 32, wherein said doped dielectric material comprises a material selected from the group consisting of borophosphosilicate glass (BPSG), borosilicate glass (BSG), and phosphosilicate glass (PSG).

* * * * *